(12) United States Patent
Olson

(10) Patent No.: US 9,054,062 B2
(45) Date of Patent: Jun. 9, 2015

(54) SYSTEMS AND METHODS FOR CURRENT SENSING OVER AN EXTENDED AREA

(75) Inventor: Chris Olson, Chicago, IL (US)

(73) Assignee: Peregrine Semiconductor Corporation, San Diego, CA (US)

( * ) Notice: Subject to any disclaimer, the term of this patent is extended or adjusted under 35 U.S.C. 154(b) by 938 days.

(21) Appl. No.: 13/040,885

(22) Filed: Mar. 4, 2011

(65) Prior Publication Data
US 2012/0223696 A1 Sep. 6, 2012

(51) Int. Cl.
*G01R 19/00* (2006.01)
*G01R 29/22* (2006.01)
*G01R 1/00* (2006.01)
*G11C 5/14* (2006.01)
*H01L 21/66* (2006.01)
*H03F 3/345* (2006.01)
*H05B 33/08* (2006.01)

(52) U.S. Cl.
CPC ....... *H01L 22/34* (2013.01); *H01L 2224/45124* (2013.01); *H05B 33/0827* (2013.01); *H03F 3/345* (2013.01); *H03F 2200/462* (2013.01); *H03F 2203/45136* (2013.01); *H01L 2924/0002* (2013.01)

(58) Field of Classification Search
CPC .............. H05B 33/0827; H01L 2224/45124; H01L 22/34
See application file for complete search history.

(56) References Cited

U.S. PATENT DOCUMENTS 6,424,131 B1 * 7/2002 Yamamoto et al. ........... 323/282
2008/0191679 A1 * 8/2008 Williams ...................... 323/282

FOREIGN PATENT DOCUMENTS

WO   WO 0150142 A1 * 7/2001
WO   WO 03043086 A2 * 5/2003

* cited by examiner

*Primary Examiner* — Patrick Assouad
*Assistant Examiner* — Hoang X Nguyen
(74) *Attorney, Agent, or Firm* — Jaquez Land Richman LLP; Martin J. Jaquez, Esq.; Alessandro Steinfl, Esq.

(57) ABSTRACT

Methods and systems for providing current sensing over an extended area, such as a substrate of an integrated circuit, are described. The described methods and systems particularly describe a circuit layout procedure and configuration that can be used to carry out current sensing at diverse locations in the extended area.

22 Claims, 2 Drawing Sheets

SYSTEMS AND METHODS FOR CURRENT SENSING OVER AN EXTENDED AREA

BACKGROUND

1. Field

The present teachings relate to sensing current. In particular, the present teachings relate to current sensing at diverse locations in an extended area such as a substrate of an integrated circuit.

2. Background

Current sensing can be carried out in a variety of ways. In a first approach, the current is propagated through a resistor having a known resistance value and the resulting voltage drop across the resistor is measured in order to determine the amplitude of the current flowing through the resistor. As can be appreciated this approach involves undesirable power wastage in the resistor, thereby leading to a reduction in the overall amount of power that can be provided to a load circuit through the resistor.

In a second approach, an operational amplifier is configured to generate a sense signal that is proportional to the value of a current flowing through a current carrying line. While the operational amplifier approach addresses the undesired output power reduction problem associated with a current sensing resistor, this second approach also suffers from several shortcomings.

Among the several shortcomings, one pertains to bandwidth. Typically, the bandwidth of an operational amplifier (especially one that is configured as a gain element incorporating a feedback circuit) has to be several orders higher than the bandwidth of an AC input signal provided to the operational amplifier. For example, if the frequency of the AC signal provided to the non-inverting terminal of an operational amplifier is around 25 MHz, the operational amplifier has to be selected to have a bandwidth of around 250 MHz (i.e., a decade multiple of the input AC frequency). This large bandwidth requirement places an undesirable limitation on the type of operational amplifier that can be used in various applications such as current sensing, consequently curtailing choices of operational amplifiers to a limited sub-set of devices amongst a plurality of available devices.

Furthermore, the large bandwidth can not only lead to unstable circuit performance (especially when the gain of the circuit is increased beyond a certain level) but also necessitates careful circuit design as well as component layout.

To elaborate upon the component layout issue, it can be understood that an operational amplifier circuit typically involves routing analog signals among various components. Several factors come into play when the circuit is active, especially when the analog signals are high frequency analog signals. These factors include, for example, cross-talk, signal-to-noise degradation, signal attenuation, and signal distortion.

Consequently, all such factors have to be taken into consideration during circuit layout when the various components of an analog circuit are laid out over an extended area, such as, for example, a substrate contained inside an integrated circuit. This task is further compounded when a plurality of identical circuits are to be laid out over a substrate and various signals that are somewhat similar in nature can interact with each other in an adverse manner.

SUMMARY

According to a first aspect of the present disclosure, a current sensing system is provided. The system includes: a substrate having an extended area; a plurality of sub-circuits, wherein each sub-circuit comprises a current sensing cell and a plurality of unit cells, and further wherein each sub-circuit is expressly placed at selected locations on the extended area of the substrate, based on a set of physical characteristics of each of the selected locations; and a control circuit that is configured to receive at least one binary current sense signal from the plurality of sub-circuits, and generate therefrom, a control signal.

According to a second aspect of the disclosure, a method for sensing current is provided. The method includes: configuring a plurality of sub-circuits, wherein each sub-circuit comprises a current sensing cell and a selected plurality of unit cells, and further wherein each of the plurality of sub-circuits is expressly placed at selected locations on the extended area of the substrate, based on a set of physical characteristics of each of the selected locations; receiving in a control circuit portion of the integrated circuit, at least one binary current sense signal provided by at least one of the plurality of sub-circuits. The binary current sense signal may be then be used to derive a current control signal for controlling a current generated in a unit cell.

Further aspects of the disclosure are shown in the specification, drawings and claims of the present application.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein. For example, it will be understood that terminology such as, for example, field-effect transistors, nodes, terminals, voltage drops, circuits, sub-circuits, applied to, connections, and coupling are used herein as a matter of convenience for description purposes and should not be interpreted literally in a narrowing sense. For example, a substrate may be alternatively understood to be a die, a node may be alternatively understood to be a terminal, and the word "layout" is to be understood in the context of other terms such as "laid out", "component placement", "locating components" etc. A person of ordinary skill in the art will understand that such terms are alternatively used in the art and must be interpreted accordingly. It will be also be understood that the drawings use certain symbols and interconnections that must be interpreted broadly as can be normally understood by persons of ordinary skill in the art. As one example, of such interpretation, the supply voltages shown in the figures indicate P-type devices and N-type devices that are coupled to a positive supply voltage and a ground terminal. A person of ordinary skill in the art will recognize that the P-type and N-type devices can be based on different technologies and types. The devices can be interconnected in various different ways, and the polarities, as well as connectivity, of the power supply voltages can be suitably tailored to these various circuit configurations without detracting from the spirit of the disclosure.

In particular, current sensing systems and methods for use in a circuit containing multiple cascode stacks are described herein. As can be understood by one of ordinary skill in the art, the described cascode stack configuration can be incorporated into a wide variety of devices such as, for example, a DC-to-DC converter, a power amplifier, or an operational amplifier. Furthermore, the current sensing methods and systems described herein can be applied to a variety of circuits and are not limited to the cascode stack configuration that is used herein as a matter of convenience for purposes of description (especially in connection with the use of a replica circuit). The use of the comparator circuit for current sensing in applications other than a cascode stack circuit can be reasonably understood by one of ordinary skill in the art from the principles described herein in this document.

Figure 1:
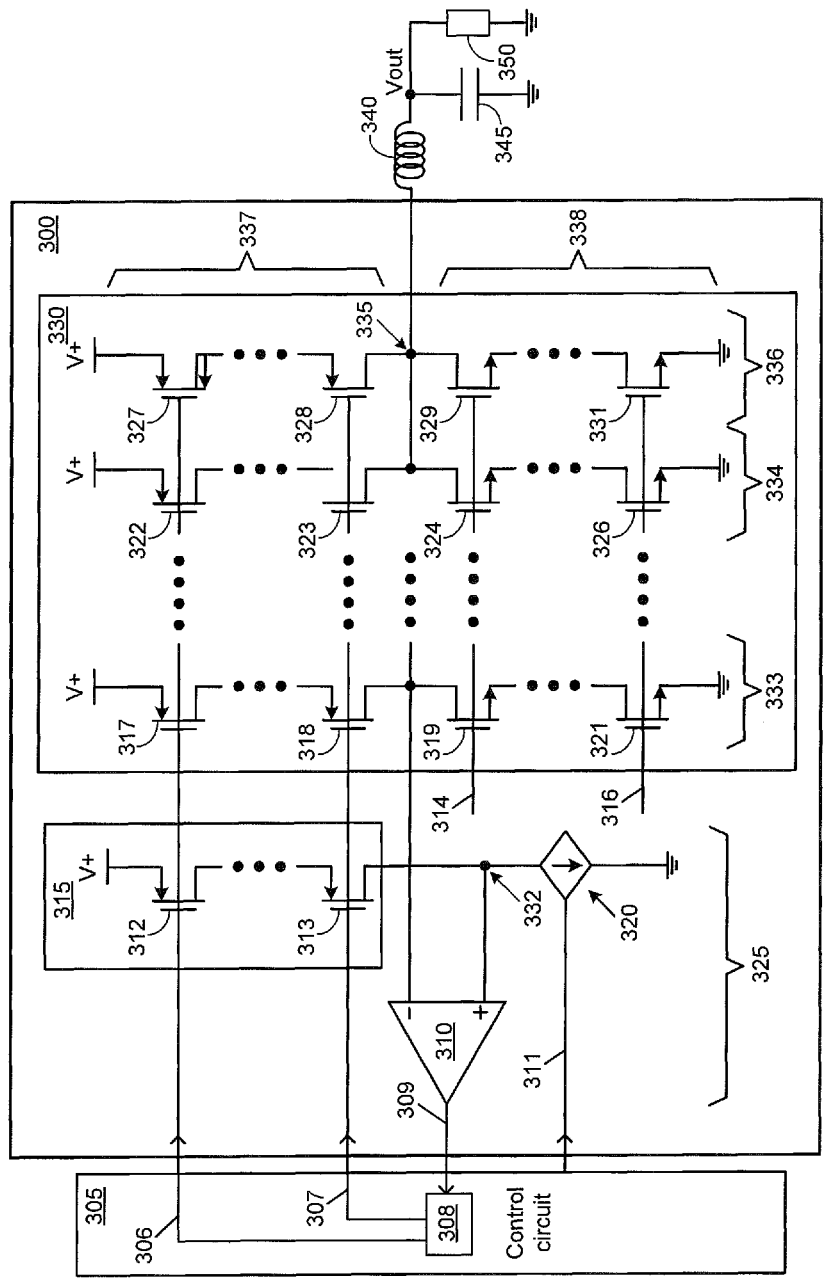
FIG. 1 shows a current sensing system that includes a sub-circuit containing a comparator for generating a binary current sense signal, in accordance with the teachings of the present disclosure.

Attention is now drawn to FIG. 1, which shows a current sensing system that includes a sub-circuit 300 coupled to a control circuit 305. Sub-circuit 300 has a comparator 310 configured to detect the amplitude of current flowing out of a cascode array 330 and into a load circuit 350.

Cascode array 330 contains a plurality of cascode stacks, each of which is referred to herein as a unit cell. Three such unit cells are shown in FIG. 1 as examples, though in various embodiments several additional unit cells may be present (as indicated by the series of dots shown in FIG. 1). The first unit cell 333 includes transistors 317, 318, 319 through 321 arranged as a first cascode stack. The second unit cell 334 includes transistors 322, 323, 324 through 326 arranged as a second cascode stack. The third unit cell 336 includes transistors 327, 328, 329 through 331 arranged as a third cascode stack. Each cascode stack has an upper leg 337 and a lower leg 338. The upper and lower legs are connected to each other at a junction node (e.g. junction node 335 of stack 336). The junction nodes of each of the stacks are interconnected together as shown, in order to provide a concatenated output current that has an amplitude equal to the sum of the individual stack currents.

The gate terminals of each row of transistors in cascode array 330 are also interconnected as shown, such that a gate drive signal can be applied simultaneously to all the gate terminals of a row. For example, a first gate drive signal transmitted via line 306 from control circuit 305, is used to simultaneously drive the first row of transistors 317, 322 and 327 in cascode array 330. Similarly, a second gate drive signal transmitted via line 307 from control circuit 305, is used to simultaneously drive the second row of transistors 318, 323 and 328 in cascode array 330; a third gate drive signal transmitted via line 314 from control circuit 305 (connection not shown), is used to simultaneously drive the third row of transistors 319, 324 and 329; and a fourth gate drive signal transmitted via line 316 from control circuit 305 (connection not shown), is used to simultaneously drive the fourth row of transistors 321, 326 and 331.

It will be understood that cascode array 330 can include any number of rows and columns depending on several factors. These factors include, for example, the $V_{DS}$ stress voltage that can be withstood by the individual transistors (determines the number of transistors located in each leg); the available power supply voltage (determines output current capacity and thermal behavior of cascode array 330); and a desired output current (determines the number of stacks to be used in cascode array 330). Some of these factors are explained below in further detail.

Each of the upper leg and the lower leg, in each individual stack contains "n" number of devices, where "n" is selected based on the applied supply voltage. For example, if the desired $V_{DS}$ drop in each of the devices is around 4 volts and the supply voltage is +12V with reference to ground, three such devices can be connected in series so as to evenly distribute the 12V potential across the three devices in each leg. In the example cascode array 330, upper leg 337 contains three P-type field effect transistors (pFETs); while lower leg 338 contains three N-type field effect transistors (nFETs). In other applications, the number "n" of transistors placed in each leg can be varied depending on the characteristics of the power supply voltage.

In operation, upper leg 337 is first placed in a conducting state, while lower leg 338 is placed in a non-conducting state. This first operation is carried out by providing switch drive signals from control circuit 305 to place each of the pFETs in upper leg 337 in a conducting state, and by placing each of the nFETS in lower leg 338 in a non-conducting state. As a result of this first operation, junction node 335 is at a V+ voltage level (minus the substantially negligible voltage drops across each of the pFETs in upper leg 337 that are in the conducting state).

At a subsequent period of time, upper leg 337 is placed in a non-conducting state while lower leg 338 is placed in a conducting state. This second operation is carried out by providing switch drive signals from control circuit 305 to place each of the pFETs in upper leg 337 in a non-conducting state, and by placing each of the nFETS in lower leg 338 in a conducting state. As a result of this second operation, junction node 335 is placed at a ground level potential (the voltage drops across each of the nFETs in lower leg 338 in the conducting state are substantially negligible).

The upper and lower legs are then cycled through the two operations described above, thus resulting in a pulse signal (AC signal) appearing at junction node 335. This pulse signal may then be propagated through a low pass filter composed of inductor 340 and capacitor 345 in order to create a DC output voltage that is provided to load circuit 350. The low pass filter is used when the cascode circuit is a part of a DC-to-DC converter. However, in other applications, the low pass filter may be omitted if an AC signal output is to be impressed upon load circuit 350 instead.

As can be understood, the AC or DC current drawn out of cascode array 330 is proportional to the impedance value of load circuit 350. Specifically, the amplitude of the voltage present at junction node 335 varies inversely with the amplitude of the current drawn out of cascode array 330 by load circuit 350. Consequently, in a voltage vs. current graph, the voltage amplitude will have a negative slope, in comparison to a positive slope of the current amplitude. A threshold value may be selected (corresponding to either a specific voltage amplitude or a specific current amplitude for example) by using this graph.

As one example, the threshold value may be set at an intersection point of the voltage and current plots. As another example, the threshold value may be set at a certain current amplitude that corresponds to a threshold current sense point at which a control action needs to be carried out. Some non-limiting examples of a suitable control action when the current amplitude reaches (or exceeds) the threshold current sense point include: a shutdown operation carried out upon cascode array 330; generation of a over-current warning signal; and/or providing a voltage boost operation in cascode array 330 to compensate for the increase in current demand.

Conversely, the threshold value may correspond to a certain voltage amplitude that is determined to be a threshold voltage sense point at which a control action is to be carried out. A non-limiting example of a suitable control action when the voltage amplitude reaches or exceeds the threshold voltage sense point (possibly as a result of reduced current demand, or a circuit failure) includes providing a bucking action in cascode array 330. Such an action may be applicable for example, in a DC-DC buck converter.

Further details pertaining to detecting a threshold sense point, specifically a threshold current sense point, and generating therefrom, a current sense signal for carrying out a control action will now be explained. Towards this end, attention is once again drawn to FIG. 1 wherein a current sensing circuit (referred to herein, as a current sensing cell 325) is shown. Current sensing cell 325 includes a comparator 310 and several other elements that are described below in more detail.

In contrast to an operational amplifier, a comparator inherently provides very high gain and also provides an output signal that can switch rapidly from one logic state to an opposing logic state in response to a differential change in input signal amplitudes.

Typically, in comparison to an operational amplifier, a comparator circuit does not suffer from issues related to stability (e.g. oscillations), thermal dissipation, and certain power supply constraints. Furthermore, unlike an operational amplifier circuit, a comparator circuit does not require an external feedback circuit with associated handicaps such as a reduction in bandwidth (lower rise/fall times and slower slew rate), the need for careful selection of other components, layout issues to avoid oscillations, real estate requirements etc.

In the example configuration shown in FIG. 1, junction node 335 is coupled to a first input terminal of comparator 310, junction node 332 is coupled into a second input terminal of comparator 310, and an output terminal of comparator 310 is coupled into control circuit 305. It will be understood that the first and second input terminals (positive and negative inputs) can be interchangeably selected for connecting to junction nodes 335 and 332, in order to provide an appropriate direction of signal swing at the output terminal of comparator 310.

Junction node 332 is located between replica circuit 315 and a variable current source 320. In a first embodiment, replica circuit 315 is formed of pFET devices 312 through 313 that replicate an upper leg 337 in any one individual stack in cascode array 330. The pFET devices 312 through 313 are located in the same substrate as the stacks in cascode array 330. This arrangement of using the same substrate material for forming all the pFETs ensures that the operating characteristics of pFETs 312 through 313 automatically matches the operating characteristics of the pFET devices in any of the individual stacks in cascode array 330. This automatic matching arrangement eliminates the need to expressly tailor the characteristics of pFETs 312 through 313 to the characteristics of pFETs contained in cascode array 330. As can be understood, express tailoring is undesirable because it would involve complicated procedures and yet may lead to an imperfect match (for example, when pFETs 312 through 313 are selected to be a part of a separate substrate, or, are discrete components that are not a part of an integrated circuit in which cascode array 330 is located).

In a second embodiment (not shown), replica circuit 315 is formed of nFET devices that replicate a lower leg 338 in any one individual stack in cascode array 330. Here again, it is preferable that these nFET devices are located in the same substrate as the stacks in cascode array 330 so as to provide automatic matching of device operating characteristics.

In a third embodiment (not shown), replica circuit 315 is formed of devices other than FETs. These devices replicate one or more devices in one or the other of the upper and lower legs in any one individual stack in cascode array 330. Such devices may include resistors, capacitors, diodes, and other components.

Irrespective of which embodiment is used, replica circuit 315 is specifically selected to have an impedance value that is a known fraction of the impedance value of all the current conducting stacks contained in cascode array 330. To elaborate on this aspect, let it be assumed for purposes of description, that replica circuit 315 is formed of pFET devices 312 through 313 that replicate an upper leg 337 in anyone 30 individual stack in cascode array 330. Let it be further assumed that cascode array 330 contains ten thousand upper legs 337. The ten thousand upper legs correspond to ten thousand current-carrying cascode stacks that are formed on a substrate of an integrated circuit. As pointed out above, the junction nodes of each of the individual cascode stacks are interconnected together as shown, in order to provide a 5 concatenated output current via junction node 335, having an amplitude equal to the sum of the individual stack currents. Consequently, for example, if the concatenated output current is equal to 10 Ampere, each individual cascode stack provides 1 mA (i.e. 1 OA/I OK=1 mA).

Because the replica circuit 315 is designed to match one upper leg of an individual cascode stack, the impedance value of replica circuit 315 automatically provides for 1 mA of current flow when replica circuit 315 is suitably configured as a current-drawing circuit.

To achieve the 1 mA current draw through replica circuit 315, a bottom end of replica circuit 315 is connected to a variable current source 320 (thereby creating junction node 332), and a top end of replica circuit 315 is connected to the same power supply (V+) as provided to cascode array 330. A suitable drive signal is provided (from control circuit 305 via line 311) to the variable current source 320 in order to configure variable current source 320 for drawing current (1 mA in the example described above) through replica circuit 315. The current flowing through replica circuit 315 is a scaled-down version of the concatenated output current (i.e. 1/m times the output current; where m=10K in the example above), and can consequently be used as a reference current for comparison purposes in comparator 310.

As can be appreciated, though comparator 310 carries out a voltage comparison function between the voltages present at junction node 335 and junction node 332, this voltage comparison is in effect a current comparison operation because the two voltages reflect the amount of current flowing through each of the two respective nodes. In other words, the voltage present at junction node 335 provides an indication of the amplitude of the output current drawn by load circuit 350 from cascode array 330 (a higher voltage represents a lower output current draw, and a lower voltage represents a higher output current draw). Similarly, the voltage present at junction node 332 provides an indication of the amplitude of the reference current drawn by variable current source 320 through replica circuit 315. It will be understood that in this particular embodiment, the voltages present at each of junction nodes 335 and 332 are AC signals. The AC signal at junction node 335 (as a result of the switching action between upper and lower legs of the cascode circuit) has been described above.

As for the AC signal at junction node 332, control circuit 305 drives the gate terminal of transistor 312 with the same first gate drive signal (switching signal transmitted via line 306 from control circuit 305) as is used to simultaneously drive the first row of transistors 317, 322 and 327 in cascode array 330. Similarly, control circuit 305 drives the gate terminal of transistor 313 with the same second gate drive signal (switching signal transmitted via line 307 from control circuit 305) as is used to simultaneously drive the second row of transistors 318, 323 and 328 in cascode array 330. This results in the AC signal being present at junction node 332.

Comparator 310 carries out a comparison of the amplitudes of the two AC signals and generates an output signal based on the difference between the two. This output signal is a binary current sense signal that takes on one of two binary states depending on a comparison threshold value that is selected for comparator 310 to change output state. In one embodiment, the comparison threshold value is set to detect an overcurrent condition wherein the current drawn from cascode array 330 by load circuit 350 exceeds a pre-determined value. In this embodiment, the binary current sense signal may be referred to as an over-current binary current sense signal.

The binary current sense signal is provided to control circuit 305 via line 309 where it is processed by a suitable logic circuit 308 in order to generate a suitable response. In one case, the response is in the form of a status signal that may provide an indication of over-current for example. In another case, the status signal is a control signal that is used for control purposes. When used for control purposes, the control signal may be implemented in the form of the first and second gate drive signals carried on lines 306 and 307. Control circuit 305 also provides gate drive signals to each row of nFETs in lower leg 338 of cascode array 330. While the connections are not shown in FIG. 1, it will be understood that the gate drive signals are provided via lines 314 and 316.

In an alternative embodiment (not shown) to the configuration of FIG. 1, the pFET devices used in replica circuit 315 are replaced with nFET devices. These nFET devices replicate a lower leg 338 in any one individual stack in cascode array 330. In terms of the characteristics of this alternative replica circuit, the remarks provided above vis-à-vis the pFET device configuration are equally applicable to this embodiment as well. It will be specifically understood that the current flowing through the pFET replica is a scaled-down version of the concatenated output current (i.e. 1/m times the output current). As can be understood by persons of ordinary skill in the art, this alternative replica circuit may be interconnected with comparator 310 in a different way in order to accommodate voltage polarity, current flow direction in variable current source 320, and other requirements.

Figure 2:
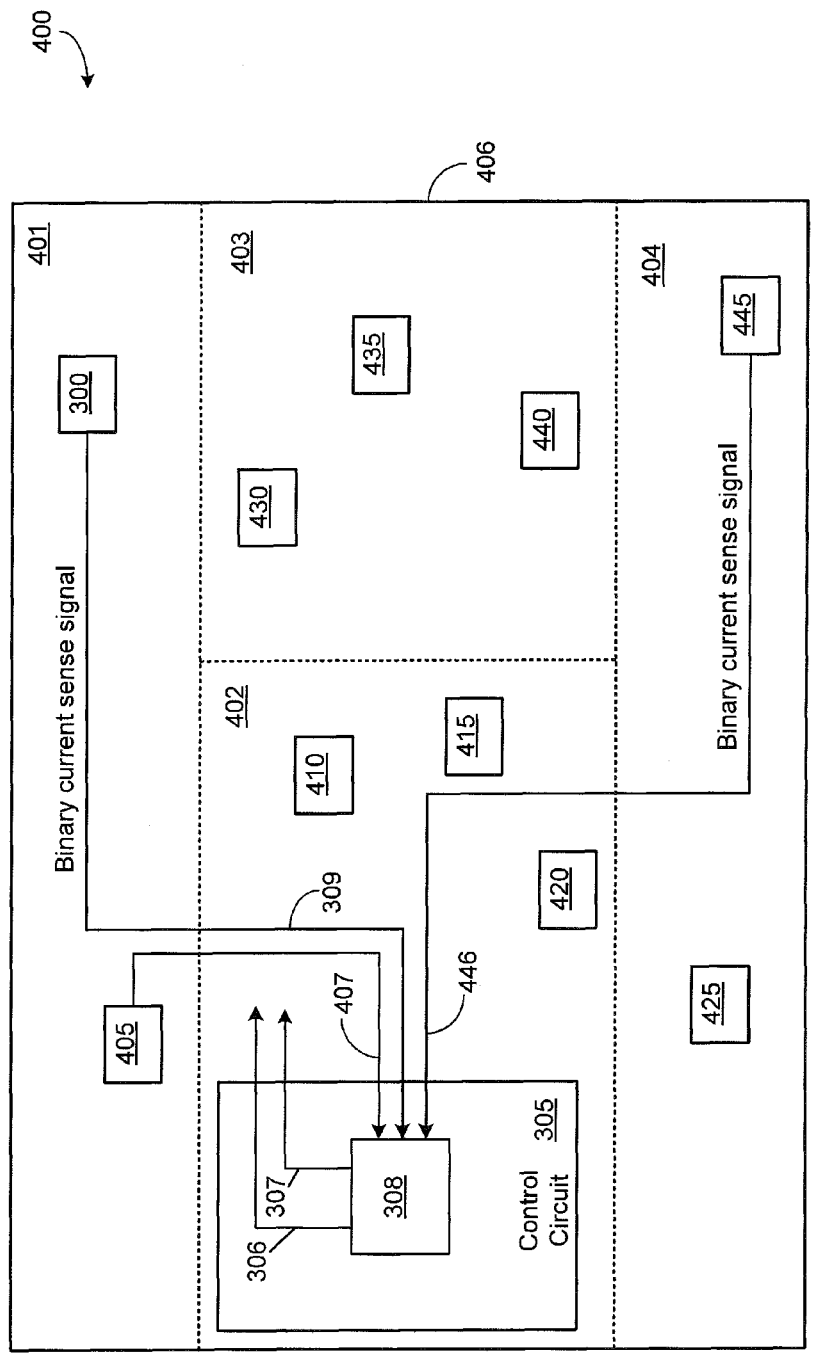
FIG. 2 shows a plurality of current sensing sub-circuits laid out over a substrate in accordance with the teachings of the present disclosure.

Attention is now drawn to FIG. 2, which shows a current sensing system 400 that includes a plurality of current sensing sub-circuits and a control circuit 305 laid out in accordance with the teachings of the present disclosure. System 400 is laid out upon an extended area 406, which is a printed circuit board (PCB) in one embodiment, and a substrate inside an integrated circuit in another embodiment. Persons of ordinary skill in the art will understand that extended area 406 can be embodied in various forms other than a PCB or a substrate. However, solely for purposes of convenience, extended area 406, will be referred to from hereon, as substrate 406.

Substrate 406 can be partitioned into multiple areas based on various parameters. It will be understood that such a partitioning is optional in nature and is not necessary in every embodiment. However, in the one embodiment described herein, substrate 406 is used to house a plurality of current generating circuits (DC-to-DC converters, for example) and consequently, the partitioning is directed at evenly distributing current flow across various areas of substrate 406. Such an even distribution of current flow provides certain benefits such as, for example, in optimizing thermal dissipation across substrate 406.

The characteristics of the current flow in the various partitions may be verified at various times. In one embodiment, the characteristics are verified as part of a manufacturing test process, and once testing has been completed, the substrate is diced into multiple segments using the partition boundaries. Each individual partition may then be suitably packaged as an independent DC-to-DC converter device, for example.

Various aspects that have to be taken into consideration when determining the locations of the plurality of current sensing sub-circuits, including for example, the physical, the thermal, and/or the electrical characteristics of the various locations across substrate 406. For example, certain areas may be less optimal than others in terms of thermal dissipation, certain areas may have better electrical conductivity than others, certain areas may provide better mechanical mounting characteristics than others, and so on.

Four partitions 401 through 404, are shown in the example partitioning of substrate 406 in FIG. 2. In other embodiments, the number of partitions; the area of each partition; and/or the aspect ratio (height vs. width) of each partition can be different. As can be seen, partition 401 contains two current sensing sub-circuits 300 and 405. It will be understood that the quantity 'two' is merely for purposes of description, and any number of circuits ranging from '0' to 'n' may be located in each partition. Details pertaining to circuit 300 have been described above with reference to FIG. 1. Circuit 405 is another current sensing circuit, which is, in one embodiment, identical to circuit 300. However, it will be understood that in other embodiments circuit 405 may bear some similarity or may bear no similarity to circuit 300. Furthermore, in certain embodiments, the current sensing circuits are independent of one another. In other embodiments, two or more of the current sensing circuits may be interconnected in various ways. One example of an interconnection is when a unit cell (for example, first unit cell 333 that includes transistors 317, 318, 319 through 321 as shown in FIG. 1) is shared between two current sensing circuits.

Irrespective of the similarity, or dissimilarity, between circuits 300 and 405, in general, both circuits include certain signal carrying elements (metal tracks, wires etc) that transport analog signals, and other signal carrying elements that are used for transporting binary signals.

In the specific example described herein, line 309 propagates the binary current sense signal that has been described above using FIG. 1. The rest of the circuitry of circuit 300 is geographically co-located within the rectangular box with the designator 300 provided within. The phrase "geographically co-located" is to be understood in the context of circuit component layout wherein certain sensitive analog signals (especially low amplitude and/or large bandwidth analog signals) are identified in circuit 300 and components associated with these sensitive analog signals are placed in proximity to one another in a manner that not only minimizes propagation distances between components, but also minimizes other adverse phenomenon such as cross-talk and electromagnetic interference (EMI) radiation.

Some examples of sensitive analog signals include: the reference voltage present at junction node 332, and the reference current flowing between replica circuit 315 and variable current source 320. As can be understood from the description above, the reference current is a very low amplitude signal (for example, a milliamp, or less) and any undesired effects upon this reference current will adversely affect the current sensing operation carried out by comparator 310. Components associated with this particular reference current include pFET devices 312 through 313 as well as components present in variable current source 320. It is preferable that comparator 310 be located as close as possible to the replica circuit 315 and variable current source 320 thereby minimizing the amount of interconnections (for example, the metal tracks/wires on a PCB or on a substrate) between the various components of current sensing cell 325. Furthermore, it is preferable that current sensing cell 325 be located as close as possible to cascode array 330. It is further preferable that the individual cascode stacks in cascode array 330 be located close to each other because each individual cascode stack provides a small amount of current that is comparable in amplitude to the reference current, and thus susceptible to adverse effects.

Signals that are less prone to adverse effects such as signal attenuation, signal distortion, cross-talk etc., can be suitably routed with a lesser degree of stringency. Specifically, as can be understood, the binary current sense signal carried on line 309 is a large amplitude signal that is produced by comparator 310. The nature of the binary signal provides better signal-to-noise performance, because the signal can tolerate certain ill effects such as attenuation and distortion, and yet convey the binary information (high or low levels) from comparator 310 to control circuit 305.

As can be observed in the example layout shown in FIG. 2, control circuit 305 is placed at a suitable location that is selected based on optimizing the routing of the plurality of binary sense signals from the plurality of current sensing sub-circuits located on substrate 406. As pointed out above, sub-circuit 405 is located in the same partition 401 as sub-circuit 300, and the binary current sense signal produced in sub-circuit 405 is coupled to control circuit 305 via line 407.

Similarly, other binary current sense signals from other sub-circuits such as circuits 410, 415, 420, ... 445 are coupled to control circuit 305 via their own individual lines.

The operation of control circuit 305 will now be described in further detail. As pointed out above, a binary current sense signal that is provided to control circuit 305 via line 309 is processed by logic circuit 308 in order to generate multiple gate drive signals carried on lines such as lines 306 and 307.

Each of the other binary current sense signals is also processed by logic circuit 308 in order to derive corresponding gate drive signals.

In one embodiment, control circuit 305 utilizes a voting process in order to accommodate missing and/or defective binary current sense signals. This voting process, which is described below in further detail, can be applied across all partitions, or may be applied to individual partitions.

When applied across all partitions, in the example circuit shown in FIG. 2, voting is implemented using all ten binary current sense signals provided by all ten circuits 300, 405, 410, ... 445. When based on individual partitions, the voting is applied for example, on the three binary current sense signals transmitted by circuits 430, 435 and 440 located in partition 403; and/or on the two binary current sense signals transmitted by circuits 300 and 405 located in partition 401; and so on.

The voting process will be described now in more detail using the example wherein the voting is applied to individual partitions. It will be understood that this description is equally pertinent to the scenario wherein the voting is applied across all partitions.

Let it be assumed that a binary current sense signal showing a logic state '1' is indicative that the current flowing out of the associated sub-circuit is below a predetermined threshold. Under normal circumstances, when each of the currents flowing out of each of the individual sub-circuits is below the predetermined threshold, each of the binary current sense signals should indicate a logic state '1'.

However, a situation may arise when one or more of the binary current sense signals originating from one particular partition fails to indicate a logic state '1' whereas the remaining binary current sense signals originating from the particular partition indicate a logic state '1'. In this situation a determination has to be made if the partition in which the circuit is located should be declared faulty (and discarded for example, after dicing substrate 406 into individual devices). One way to make this determination is to apply a majority vote upon the binary current sense signals originating from the particular partition.

The binary current signal that fails to indicate a logic state '1' in the example scenario above, may take various forms. For example, in one case, the signal may be temporarily at a logic state '0'. In another case, the signal may be stuck permanently at a logic state '0' and does not toggle to the opposite state. In yet another case, the signal may be non-existent. Various factors come into play for causing such conditions. Some non-limiting examples include: a defective metal track, a physical defect in a portion of the substrate, and/or an electrical malfunction. The defective metal track may be caused for example as a result of a circuit layout error, or as a result of an open-circuit or short-circuit due to excessive current flow. A defective substrate may be caused by factors such as EMI effects, and/or defective material processing/handling. An electrical malfunction may be manifested as an open circuit or a short circuit as a result of defective operation or misuse. Persons of ordinary skill can understand various other reasons for defective operation of the current sense signals.

Logic circuit 308 contained in control circuit 305 can be used to implement the voting process and generate a suitable output signal such as for example, a shutdown signal, a gate control signal, and/or a status indication signal.

Irrespective of the fact that a voting process may or may not be used in the various embodiments, current sensing system 400 provides a number of advantages. These advantages, which are derived from the various features described above (partitioning, component layout, testing, control, etc) leads to robust circuit operation as well as reliability.

In summary, a number of embodiments of the present inventive concept have been described above. Nevertheless, it will be understood that various modifications may be made without departing from the scope of the inventive teachings.

Accordingly, it is to be understood that the inventive concept is not to be limited by the specific illustrated embodiments, but only by the scope of the appended claims. The description may provide examples of similar features as are recited in the claims, but it should not be assumed that such similar features are identical to those in the claims unless such identity is essential to comprehend the scope of the claim. In some instances the intended distinction between claim features and description features is underscored by using slightly different terminology.

What is claimed is:

1. A current sensing system comprising:
a plurality of sub-circuits, wherein each sub-circuit comprises a current sensing cell and a plurality of unit cells wherein each unit cell comprises a cascode stack including i) an upper leg containing at least one field-effect transistor (FET), and ii) a lower leg containing at least one FET, a common point at which the upper leg of each unit cell and the lower leg of each unit cell are coupled to one another and coupled to a first terminal of a load, a second terminal of the load coupled to ground; and a control circuit that is configured to receive at least one binary current sense signal from the plurality of sub-circuits and generate therefrom, a control signal, the control circuit providing signals to each FET of the upper leg and lower leg, the control signals causing the FETs of the upper leg to turn on at the same time that the FETs of the lower leg turn off and causing the FETs of the lower leg to turn on at the same time that the FETs of the upper leg turn off.

2. The current sensing system of claim 1, wherein each sub-circuit is expressly placed at selected locations on an extended area of a substrate based on a set of physical characteristics of each of the selected locations, wherein the set of physical characteristics comprises one or more of: a) thermal dissipation, b) electrical conductivity, and c) mechanical mounting, and wherein a first set of physical characteristics of a first selected location is different than a second set of physical characteristics of a second selected location.

3. The current sensing system of claim 1, wherein the control signal is configured as a current control signal for controlling a current generated in at least one of the plurality of unit cells.

4. The current sensing system of claim 1, wherein the upper leg and the lower leg contain a same number of FETs based on an applied supply voltage to the cascode stack and wherein the first type is one of: a) a P-type FET, and b) an N-type FET.

5. The current sensing system of claim 4, wherein each current sensing cell comprises:
a replica circuit that replicates at least a portion of a first cascode stack contained in a first unit cell;
a controllable current source operable to set a desired reference current flowing through the replica circuit; and
a comparator having a first input node configured to receive a first voltage that varies in accordance with output current drawn from a first plurality of unit cells, a second input node configured to receive a reference voltage that varies in accordance with the desired reference current, and an output node that outputs a first binary current sense signal.

6. The current sensing system of claim 5, wherein the current sensing cell and the first plurality of unit cells contained in each sub-circuit are located substantially close to each other in order to minimize signal degradation in metal tracks configured to carry analog signals.

7. The current sensing system of claim 6, wherein at least one of the analog signals comprises the desired reference current.

8. The current sensing system of claim 7, wherein the amplitude of the reference voltage, which varies in accordance with the desired reference current, is substantially smaller than the amplitude of the binary current sense signal.

9. The current sensing system of claim 2, wherein the substrate is the substrate of an integrated circuit and the number of binary current sense signals received by the control circuit is smaller than the number of sub-circuits contained in the integrated circuit.

10. The current sensing system of claim 9, wherein the number of binary current sense signals received by the control circuit is smaller than the number of sub-circuits contained in the integrated circuit because of a defective sub-circuit.

11. The current sensing system of claim 10, wherein the defective sub-circuit is caused by a defect in the substrate.

12. The current sensing system of claim 10, wherein the defective sub-circuit is caused by an operational failure.

13. The current sensing system of claim 1, wherein the at least one binary current sense signal received by the control circuit comprises a plurality of binary current sense signals that include a first set of binary current sense signals indicating a first binary state, and a second set of binary current sense signals indicating a second binary state that is an opposite of the first binary state.

14. The current sensing system of claim 13, wherein the control circuit is configured to implement a voting process upon the first and the second set of binary current sense signals such that the voting process accommodates missing or defective binary current sense signals for generating the control signal.

15. A method for sensing current inside an integrated circuit having unit cells spread out over an extended area of a substrate, the method comprising:
providing a plurality of sub-circuits, wherein each sub-circuit comprises a current sensing cell and a selected plurality of unit cells wherein each unit cell comprises a cascode stack including i) an upper leg containing at least one field-effect transistor (FET), and ii) a lower leg containing at least one FET, a common point at which the upper leg of each unit cell and the lower leg of each unit cell are coupled to one another and to a first terminal of a load, a second terminal of the load coupled to ground;
receiving in a control circuit portion of the integrated circuit, at least one binary current sense signal provided by at least one of the plurality of sub-circuits; and
generating from the at least one binary current sense signal, a control signal, the control circuit providing signals to each FET of the upper leg and lower leg, the control signals causing the FETs of the upper leg to turn on at the same time that the FETs of the lower leg turn off and causing the FETs of the lower leg to turn on at the same time that the FETs of the upper leg turn off.

16. The method of claim 15, wherein the control signal is configured as a current control signal for controlling a current generated in at least one of the plurality of unit cells.

17. The method of claim 15, wherein each the upper leg and the lower leg contain a same number of FETs based on an applied supply voltage to the cascode stack and wherein the first type is one of: a) a P-type FET, and b) an N-type FET.

18. The method of claim 17, wherein each current sensing cell comprises:
a replica circuit that replicates at least a portion of a first cascode stack contained in a first unit cell;
a controllable current source operable to set a desired reference current flowing through the replica circuit; and
a comparator having a first input node configured to receive a first voltage that varies in accordance with output current drawn from a first group of the plurality of unit cells, a second input node configured to receive a reference voltage that varies in accordance with the desired reference current, and an output node that outputs a first binary current sense signal.

19. The method of claim 15, wherein expressly locating each of the plurality of sub-circuits at selected locations on the extended area of the substrate comprises locating the current sensing cell and the subset of unit cells contained in each individual sub-circuit substantially close to each other in order to minimize signal degradation in metal tracks configured to carry analog signals.

20. The method of claim 15, wherein receiving in the control circuit portion of the integrated circuit, the at least one binary current sense signal provided by the at least one of the plurality of sub-circuits comprises:

receiving a first set of binary current sense signals indicating a first binary state, and each of a second set of binary current sense signals indicating a second binary state that is an opposite of the first binary state.

21. The method of claim 20, further comprising:
implementing, in order to accommodate missing or defective binary current sense signals, a voting process upon the first and the second set of binary current sense signals to generate the control signal.

22. The method of claim 20, wherein receiving in the control circuit portion of the integrated circuit, the at least one binary current sense signal provided by the at least one of the plurality of sub-circuits comprises:
receiving a smaller number of binary current sense signals than the number of sub-circuits contained in the integrated circuit, because of a defective sub-circuit.

\* \* \* \* \*